(12) United States Patent
Yokogawa et al.

(10) Patent No.: US 6,762,553 B1
(45) Date of Patent: *Jul. 13, 2004

(54) SUBSTRATE FOR LIGHT EMITTING DEVICE, LIGHT EMITTING DEVICE AND PROCESS FOR PRODUCTION OF LIGHT EMITTING DEVICE

(75) Inventors: Hiroshi Yokogawa, Kadoma (JP); Tetsuo Tsutsui, 66, Momijigaoka-Higashi 8-chome, Kasuga-shi, Fukuoka-ken (JP); Masaru Yokoyama, Kadoma (JP); Kenji Tsubaki, Kadoma (JP); Kenji Kawano, Kadoma (JP)

(73) Assignees: Matsushita Electric Works, Ltd., Kadoma (JP); Tetsuo Tsutsui, Kasuga (JP)

( * ) Notice: Subject to any disclaimer, the term of this patent is extended or adjusted under 35 U.S.C. 154(b) by 349 days.

(21) Appl. No.: 09/708,657

(22) Filed: Nov. 9, 2000

(30) Foreign Application Priority Data

Nov. 10, 1999 (JP) .......................................... 11-319856

(51) Int. Cl.[7] ................................................ H01J 1/62
(52) U.S. Cl. ........................ 313/509; 313/502; 313/503; 313/504; 313/506; 313/483; 313/486; 313/512; 313/498
(58) Field of Search ................................ 313/502, 503, 313/509, 504, 483, 486, 506, 512, 498

(56) References Cited

U.S. PATENT DOCUMENTS

| | | | |
|---|---|---|---|
| 3,573,529 A | | 4/1971 | Tomii .......................... 313/92 |
| 4,402,927 A | | 9/1983 | Von Dardel et al. ........ 423/335 |
| 4,432,956 A | | 2/1984 | Zarzycki et al. ............ 423/338 |
| 4,455,506 A | * | 6/1984 | Ayyagari et al. ............ 313/506 |
| 4,458,177 A | * | 7/1984 | Hunter et al. ............... 313/511 |

(List continued on next page.)

FOREIGN PATENT DOCUMENTS

| | | |
|---|---|---|
| JP | 5-279011 | 10/1993 |
| JP | 7-138375 | 5/1995 |
| JP | 8-504674 | 5/1996 |
| JP | 10-508569 | 8/1998 |
| WO | WO 94/25149 | 11/1994 |
| WO | WO 99/04312 | 1/1999 |

OTHER PUBLICATIONS

Stefan Walheim, et al., Science, vol. 283, pp. 520–522, "Nanophase–Separated Polymer–Films as High–Performance Antireflection Coatings", Jan. 22, 1999.

C. W. Tang, et al., Applied Physics Letter, vol. 51, No. 12, pp. 913–915, XP–000565272, "Organic Electroluminescent Diodes", Sep. 21, 1987.

(List continued on next page.)

*Primary Examiner*—Edward J. Glick
*Assistant Examiner*—Jurie Yun
(74) *Attorney, Agent, or Firm*—Oblon, Spivak, McClelland, Maier & Neustadt, P.C.

(57) ABSTRACT

There is provided a substrate for a light emitting device which includes an electrically conductive and transparent film which is in contact with a surface of a low refractive index member of which refractive index is greater than 1 and not greater than 1.30. In a preferable embodiment, the substrate further comprises a transparent member on its surface which is opposed to its surface which has the electrically conductive and transparent film. There is further provided a light emitting device which includes such substrate and a luminous layer, and the luminous layer is located on the electrically conductive and transparent film.

With such light emitting device, a ratio of light which is withdrawn outside through the low refractive index member is increased, so that a coupling-out efficiency for surface emission of light withdrawn into the ambient air is increased.

23 Claims, 9 Drawing Sheets

1... low refractive index member
1a... silica aerogel
2... electrically conductive transparent film

U.S. PATENT DOCUMENTS

| | | | | |
|---|---|---|---|---|
| 4,610,863 A | | 9/1986 | Tewari et al. | 423/338 |
| 4,654,559 A | * | 3/1987 | Hinotani et al. | 313/422 |
| 4,849,673 A | | 7/1989 | Werring et al. | 313/506 |
| 5,086,085 A | | 2/1992 | Pekala | 521/187 |
| 5,124,364 A | | 6/1992 | Wolff et al. | 521/55 |
| 5,137,927 A | | 8/1992 | Wolff et al. | 521/54 |
| 5,221,364 A | | 6/1993 | Hotaling | 136/249 |
| 5,313,485 A | | 5/1994 | Hamil et al. | 372/69 |
| 5,525,857 A | * | 6/1996 | Gnade et al. | 313/309 |
| 5,689,151 A | * | 11/1997 | Wallace et al. | 313/495 |
| 5,759,506 A | | 6/1998 | Jansen et al. | 423/338 |
| 5,792,509 A | | 8/1998 | Lin et al. | 427/64 |
| 5,807,607 A | | 9/1998 | Smith et al. | 427/96 |
| 5,830,387 A | | 11/1998 | Yokogawa et al. | 252/315.2 |
| 5,885,843 A | * | 3/1999 | Ayers et al. | 436/136 |
| 5,936,345 A | * | 8/1999 | Hora | 313/506 |

OTHER PUBLICATIONS

A. Haugeneder, et al., Journal of Applied Physics, vol. 85, No. 2, pp. 1124–1130, XP–000902019, "Nonlinear Emission and Recombination in Conjugated Polymer Waveguides", Jan. 15, 1999.

Sally A. C. Glauser, et al., Mat. Res. Soc. Symp. Proc., vol. 471, XP–009010794, pp. 331–334, "Luminescent Studies of Fluorescent Chromophore–Doped Silica Aerogels for Flat Panel Display Applications", 1997.

C. M. Mo, et al., Journal of Applied Physics, vol. 83, No. 8, XP–002248542, pp. 4389–4391, "Enhancement Effect of Photoluminescence in Assemblies of Nano–ZnO Particles/Silica Aerogels", Apr. 15, 1998.

* cited by examiner

1... low refractive index member
1a... silica aerogel
2... electrically conductive transparent film

SUBSTRATE FOR LIGHT EMITTING DEVICE, LIGHT EMITTING DEVICE AND PROCESS FOR PRODUCTION OF LIGHT EMITTING DEVICE

BACKGROUND OF THE INVENTION

1. Field of the Invention

The present invention relates to a substrate for a light emitting device, a light emitting device, and a process for the production of a light emitting device. Particularly, the present invention relates to a light emitting device which is used for various devices such as a displaying device, an indication devices and a back lighting device for a liquid crystal display, a substrate used for the production of such light emitting device, and a production process for such light emitting device. In the light emitting device as described above, various light emitting mechanisms (such as an electroluminescent (which may be referred to as "EL") mechanism, a photoluminescent (which may be referred to as "PL") mechanism, and a light emission mechanism by means of electron radiation) may be used. In addition, the present invention relates to a plane lamp (such as a flat fluorescent lamp) or a plasma display panel in which such light emitting device is used.

2. Description of the Related Art

Hitherto, various displaying devices have been developed with progress of the intelligent society. One of those devices is an EL device (or an electroluminescent device) which is expected to be used for an electronic display of a self-emission type. The EL device makes use of a luminous phenomenon which occurs upon application of an electric field to a material, and has a structure in which an inorganic EL layer or a organic EL layer is sandwiched by electrodes.

FIG. 11 shows a basic structure of one example of such an organic EL device wherein a transparent electrode 12 as an anode which is made of indium-tin oxide (ITO), an organic EL layer 13 and an back metal electrode 14 as a cathode are laminated in the referred order on a glass plate 11. In such a device, a hole injected from the transparent electrode 12 and an electron injected from the back metal electrode 14 recombines in the organic EL layer 13, whereby an emission center such as a fluorescent dye is excited to result in the light emission. The light emitted in the organic EL layer 13 ejects from the glass plate 11 directly or after being reflected by the back metal electrode 14 made of for example aluminum.

Upon the ejection of the light as described above, an external efficiency ($\eta$, which is also referred to as a coupling-out efficiency) which is defined by a ratio of a light quantity drawn outside the light emitting device to a light quantity generated inside the light emitting device is determined by the critical angle $\theta c$ when the light is totally reflected upon its ejection from a medium of which refractive index is n to the ambient air of which refractive index is 1.0 according to a theory of the classical optics. According to the laws of refraction, the critical angle $\theta c$ is given by the following equation (1):

$$\sin \theta c = 1/n \tag{1}$$

The external efficiency ($\eta$) is obtained by the following equation (2) based on a ratio of a quantity of light passing into the ambient air from the medium of which refractive index is n to a quantity of the generated light (i.e. sum of a quantity of light totally reflected at an interface between the air and the medium and a quantity of light passing into the air):

$$\eta = 1 - (n^2 - 1)^{1/2}/n \tag{2}$$

It is noted that when the refractive index n of the medium is greater than 1.5, the following approximate equation (3) may be used:

$$\eta = 1/(2n_2) \tag{3}$$

However, when the refractive index n of the medium is close to 1.00, the above equation (2) has to be used.

Since a thickness of the organic EL layer 13 and a thickness of the transparent electrode 12 are smaller than a wavelength of the light, a refractive index of the glass plate 11 mainly contributes to the external efficiency ($\eta$). The refractive index of the glass is generally in the range between about 1.5 and 1.6, so that the external efficiency ($\eta$) is about 0.2 (20%) according to the equation (3). The balance which is about 80% is lost as guided light by means of the total reflection between the glass plate 11 and the ambient air.

In the above, an example in which the inorganic or organic EL layer is used as a light emitting member has been explained, and the same explanation is applicable to a PL device in which a PL light emitting layer 15 is used as a light emitting member. FIG. 12 shows a basic structure of the PL device in which a PL light emitting layer 15 is laminated on a glass plate 11. With the PL device, when a ray such as an ultraviolet ray is irradiated onto the PL layer 15, the PL layer 15 generates light, which ejects from the glass plate 11. For the PL device, the external efficiency ($\eta$) is small as in the case of the above EL device, and much light is lost as the guided light.

DISCLOSURE OF THE INVENTION

As described above, the external efficiency upon drawing the light generated in the EL device or the PL device from the device into the ambient air (i.e. a coupling-out efficiency for surface emission) is small, and such a small external efficiency is a problem not only to the EL device or the PL device but also to a general problem throughout a light emitting device which ejects surface plane-form light generated in the device into the ambient air.

The present invention has been made considering the above problem, and an object of the present invention is to provide a light emitting device of which external efficiency to draw light outside is higher and of which surface luminance is higher, a substrate for such light emitting device and a process for the production of such light emitting device.

In the first aspect, the present invention provides a substrate for a light emitting device which substrate comprises an electrically conductive transparent film (electrically conductive and transparent film) which is in contact with at least one surface of a low refractive index member. The substrate leads to a higher external efficiency of light which passes through the low refractive index member into the air, so that using such substrate makes it possible to produce a light emitting device of which external efficiency is higher to draw the light into the outside of the device.

In the first aspect, the substrate for the light emitting device in the first embodiment is characterized in that it includes the electrically conductive transparent film which is in contact with the at least one surface of the low refractive index member of which refractive index is greater than 1 and not greater than 1.30. This substrate leads to a particularly higher external efficiency of light which passes through the low refractive index member into the air, so that using such substrate results in an effective light emitting device of which external efficiency is higher to draw the light into the outside of the device.

For example, the low refractive index member may be for example in the form of a layer, a sheet or a plate, and has the electrically conductive transparent film on one of two surfaces which define the low refractive index member. The low refractive index member may be considerably thicker in the above described form, and in such case, the low refractive index member may have substantially at least three surfaces, and for example it may be in the form of a rectangular parallelepiped, in which the low refractive index member may have two or more surfaces which have the electrically conductive transparent electrodes respectively. In the first embodiment of the first aspect, the refractive index of the low refractive index member is in the range preferably between 1.003 and 1.300 and more preferably between 1.01 and 1.2.

In the first aspect, the substrate for the light emitting device in the second embodiment is characterized in that the low refractive index member in the first embodiment of the first aspect is made of an aerogel. The aerogel may be any known aerogel as far as its refractive index is small as described above. In the substrate, when the aerogel is used, it is advantageous in that the low refractive index member which has a further lower refractive index in the above specified range is obtained.

In the first aspect, the substrate for the light emitting device in the third embodiment is characterized in that the low refractive index member in the first or second embodiment of the first aspect is made of a silica aerogel. The silica aerogel may be any known silica aerogel as far as it has the low refractive index. When the silica aerogel is used for the low refractive index member, it is advantageous in that the low refractive index member has excellent transparency and that it is inorganic so that it is stable upon the preparation of the electrically conductive transparent film.

In the first aspect, the substrate for the light emitting device in the fourth embodiment is characterized in that the low refractive index member in any one of the first to the third embodiments of the first aspect has two surfaces which are opposed to each other, and the electrically conductive transparent film is positioned on one of those surfaces and a transparent member is positioned on the other surface. That is, the electrically conductive transparent film is placed on a surface of one side of the low refractive index member while the transparent member is placed on a surface of the other side of the low refractive index member. Placing the transparent member as described above results in the protection of the low refractive index member by means of the transparent member. In addition, since the transparent member supports the low refractive index member, the strength of the substrate as a whole is conferred. As a result, the low refractive index member can be formed in a smaller thickness.

In the first aspect, the substrate for the light emitting device in the fifth embodiment is characterized in that the electrically conductive transparent film in any one of the first to the fourth embodiments of the first aspect is made of at least one material selected from the group consisting of indium-tin oxide (ITO), indium-zinc oxide, zinc-aluminum oxide, gold, silver, copper and chromium. The electrically conductive transparent film is particularly preferably made of indium-tin oxide (ITO). Since those materials make possible to form the electrically conductive transparent film having a higher transparency, the substrate for the light emitting device according to the present invention is preferable for the light emitting device.

In the first aspect, the substrate for the light emitting device in the sixth embodiment is characterized in that the transparent member in any one of the first to the fifth embodiments of the first aspect is made of a glass or a transparent resin (or a plastic material). The transparent member of the glass or the transparent resin may be for example in the form of a layer, a sheet or a plate, or it may be a considerably thicker form. Forming the transparent member of the glass or the transparent resin makes the transparent member itself strong, so that the strength of the substrate is ensured. In addition, the transparent member protects the low refractive index member.

In the first aspect, the substrate for the light emitting device in the seventh embodiment is characterized in that the low refractive index member such as one made of the silica aerogel in any one of the first to the six embodiments of the first aspect is in the form of a thin film. In this embodiment, when the low refractive index member is in the form of the thin film made of the aerogel such as the silica aerogel, spin-coating or dip-coating on the transparent member followed by supercritical drying can easily form the aerogel such as the silica aerogel in the form of the thin film.

In the first aspect, the substrate for the light emitting device in the eighth embodiment is characterized in that the low refractive index member such as one made of the silica aerogel in any one of the first to the seventh embodiments of the first aspect has been made hydrophobic. When the low refractive index member has been made hydrophobic, degradation of performances of the aerogel such as the silica aerogel as to for example the refractive index and the light transparency is prevented.

In the second aspect, the present invention provides a light emitting device which comprises a luminous layer and the substrate for the light emitting device according to the first aspect, and particularly according to any one of the first to the eighth embodiments of the first aspect. This light emitting device uses the substrate for the light emitting device which provides the higher light external efficiency so that a larger quantity of the light generated in the luminous layer is drawn into the outside (i.e. into the ambient (or surrounding) air) of the light emitting device.

In the second aspect, the light emitting device in the first embodiment of the second aspect is characterized in that it comprises the luminous layer and the substrate for the light emitting device according to the first aspect, and particularly according to any one of the first to the eighth embodiments of the first aspect, and that the electrically conductive transparent film has the luminous layer on its one surface which is opposite to its other surface which has the low refractive index member thereon. That is, this light emitting device has the luminous layer on a surface of the substrate for the light emitting device which surface is opposed to the low refractive index. When such light emitting device is used, upon drawing the light which is generated in the luminous layer into the ambient air, the external efficiency of the light which passes through the low refractive index member into the air is increased.

In the second aspect, the light emitting device in the second embodiment of the second aspect is characterized in that the luminous layer in the first embodiment of the second aspect is an organic EL layer. This light emitting device has a higher external efficiency of the light generated in the luminous layer, passing through the low refractive index member and withdrawn into the ambient air.

In the second aspect, the light emitting device in the third embodiment of the second aspect is characterized in that the luminous layer in the first embodiment of the second aspect is an inorganic EL layer. This light emitting device has a higher external efficiency of the light generated in the luminous layer, passing through the low refractive index member and withdrawn into the ambient air.

In the third aspect, the present invention provides another light emitting device which comprises a luminous layer which is in contact with a low refractive index member. This light emitting device has a higher external efficiency of the light which passes from the luminous layer, through the low refractive index member and into the air is increased.

In the third aspect, the light emitting device in the first embodiment of the third aspect is characterized in that it comprises the luminous layer which is in contact with at least one surface of the low refractive index member of which refractive index is greater than 1 and not greater than 1.30. With this light emitting device, a ratio of a quantity of light which passes through the low refractive index member and ejects into the ambient air to a quantity of light which generates in the luminous layer, that is the light external efficiency is particularly increased.

In the third aspect, the light emitting device in the second embodiment of the third aspect is characterized in that the low refractive index member in the first embodiment of the third aspect is in the form of a thin film and is located on a transparent member, and the luminous layer is located on the low refractive index member in the form of the thin film.

In the third aspect, the light emitting device in the third embodiment of the third aspect is characterized in that the low refractive index member in the first or the second embodiment of the third aspect is made of an aerogel, and preferably of a silica aerogel.

In the third aspect, the light emitting device in the fourth embodiment of the third aspect is characterized in that the transparent member in the second or the third embodiment of the third aspect is a plate and preferably a glass plate.

In the third aspect, as to the low refractive index member having the refractive index greater than 1 and not greater than 1.30, the low refractive index member being in the form of the thin film, the low refractive index member being made of the aerogel and preferably made of the silica aerogel, and the transparent member being in the form of the plate and preferably in the form of the glass plate, it is to be noted that the explanations described above in conjunction with the same matters in the first aspect are applicable.

Therefore, in the third aspect, one example of the light emitting device is a plane light emitting device in which the luminous layer (such as a PL luminous layer) is formed above the glass plate, and the silica aerogel in the form of the thin film is formed between the glass plate and the luminous layer (such as a PL luminous layer). With such a plane light emitting device, the light which generates in the luminous layer passes through the silica aerogel thin film having the lower refractive index and goes into the glass plate, so that a ratio of a quantity of the light which is lost as the guided wave is reduced and the external efficiency of the light which is withdrawn from the surface of the glass plate (i.e. the coupling-out efficiency for surface emission) is increased, whereby the luminance of the glass plate surface is increased.

In the fourth aspect, the present invention provides a further light emitting device characterized in that it comprises a luminous layer located on a transparent member, and the luminous layer is made of a low refractive index member which contains particles of a luminescent material dispersed therein or which carries such particles. With this light emitting device, the luminous layer is made of a material for the low refractive index material and the luminescent material in the form of the particles, and such luminous layer having the particles and formed in the light emitting device is produced by forming a coating of a slurry which contains the particles and a binder followed by firing the coating so as to attach the luminous layer to the transparent member strongly. This aspect is advantageous in that the material for the low refractive index functions as the binder, so that the external efficiency of the light is increased In the fourth aspect, the light emitting device in the first embodiment of the fourth aspect is characterized in that the low refractive index itself (i.e. the material for the low refractive index) has a refractive index which is greater than 1 and not greater than 1.3, and that the luminous layer is located in contact with at least one surface of the transparent member.

In the fourth aspect, the light emitting device in the second embodiment of the fourth aspect is characterized in that the low refractive index in the first embodiment of the fourth aspect is made of an aerogel and preferably of a silica aerogel.

In the fourth aspect, the light emitting device in the third embodiment of the fourth aspect is characterized in that the transparent member in the first or the second embodiment of the fourth aspect is in the form of a plate and preferably in the form of a glass plate. In this embodiment, the luminous layer is preferably located on one of two surfaces which defines the transparent member and which are opposed with each other.

In the fourth aspect, as to the low refractive index member having the refractive index greater than 1 and not greater than 1.30, the low refractive index member being in the form of the thin film, the low refractive index member being made of the aerogel and preferably made of the silica aerogel, and the transparent member being in the form of the plate and preferably in the form of the glass plate, it is to be noted that the explanations described above in conjunction with the same matters in the first aspect are applicable.

Therefore, in the fourth aspect, one example of the light emitting device is a plane light emitting device in which the luminous layer is made of the thin film of the silica aerogel which contains the particles of the luminescent material (such as a PL luminescent material) dispersed therein or which carries such particles. With such a plane light emitting device, the light which generates in the particles of the luminescent material passes through the silica aerogel around the particles having the lower refractive index and goes into the glass plate, so that a ratio of a quantity of the light which is lost as the guided wave is reduced and the external efficiency of the light which is withdrawn from the surface of the glass plate is increased, whereby the luminance of the glass plate surface is increased.

The luminous layer of the light emitting device in any one of the embodiments of the third and the fourth aspects may be a PL luminous layer or a layer which emits light by means of irradiation of an electron for an electron beam). In such light emitting device, since the luminous layer emits light by means of the photoluminescence or the electron irradiation, an electrically conductive film is not necessarily formed on a surface of the low refractive index member, and it is advantageous in that even when the electrically conductive film is formed, a light emitting performance of the light emitting device is not so affected by performances of the electrically conductive film.

In the fifth aspect, the present invention provides a process for the production of a light emitting device, and particularly the light emitting device according to the fourth embodiment of the third aspect. This process is to produce a light emitting device comprising a silica aerogel thin film on a glass plate and a luminous layer (such as a layer made of a PL luminescent material) on the silica aerogel thin film, which process is characterized in that an alkoxysilane solution is applied on the glass plate followed by gelation of the solution to form a gel material and drying the gel material whereby the silica aerogel thin film is formed, and then the luminous layer is formed on the silica aerogel thin film. With this process, the silica aerogel thin film is easily formed so that the production of the light emitting device such as a plane light emitting device becomes easy.

In the sixth aspect, the present invention provides a process for the production of a light emitting device, and particularly the light emitting device according to the third embodiment of the fourth aspect. This process is to produce a light emitting device comprising a luminous layer on a glass plate which layer is made of a low refractive index member in the form of a thin film which contains particles of the luminescent material dispersed therein or which carries such particles, which process is characterized in that an alkoxysilane solution which contains the particles dispersed therein is applied on the glass plate followed by gelation of the solution to form a gel material and drying the gel material whereby the luminous layer in is formed as the thin film which is made of the silica aerogel which contains the particles of the luminescent material dispersed therein or which carries such particles. With this process, the silica aerogel thin film which functions as the luminous layer is easily formed so that the production of the light emitting device such as a plane light emitting device becomes easy.

In the seventh aspect, the present invention provides a plane lamp (for example a flat fluorescent lamp) comprising a plane light emitting device characterized in that the light emitting device of the fourth embodiment of the third aspect or the third embodiment of the fourth aspect is used as the plane light emitting device. With this plane lamp, since a luminous plane is formed by means of the plane light emitting device as described above, and the luminance of a surface of the plane light emitting device is large, a bright plane lamp is produced.

In the eighth aspect, the present invention provides a plasma display comprising a plane light emitting device characterized in that the light emitting device of the fourth embodiment of the third aspect or the third embodiment of the fourth aspect is used as the plane light emitting device. With this plasma display, since a luminous plane is formed by means of the plane light emitting device as described above, and the luminance of a surface of the plane light emitting device is large, a bright plasma display is produced.

It is to be noted that the light emitting device according to the present invention may be flat or curved as a whole. That is, the forms of the substrate for the light emitting device and the luminous layer which form the light emitting device may be flat or curved. Thus, when the light emitting device is of a flat form, each of the low refractive index member, the electrically conductive transparent film and the transparent member is flat. When the light emitting device is of a curved form, each of the low refractive index member, the electrically conductive transparent film and the transparent member is curved with substantially the same curvature. When the flat light emitting device is used, a flat plane lamp or a flat plasma display is produced. When the curved light emitting device is used, a curved plane lamp or a curved plasma display is produced.

In any one of the embodiments of any one of the aspect as described above, a material for the low refractive index member may be an aerogel, and particularly a silica aerogel. The form of the low refractive index member may be a layer, a sheet or a plate of which thickness dimension is considerably smaller than the other dimensions, or the form of the low refractive index member may have a thickness dimension which is of the same order as the other dimensions. An appropriate form of the low refractive index member may be selected depending on the application of the substrate for the light emitting device or the light emitting device itself.

In addition, in any one of the embodiments of any one of the aspect as described above, a material for the transparent member is a transparent glass or a transparent resin. The form of the transparent member may be a layer, a sheet or a plate of which thickness dimension is considerably smaller than the other dimensions, or the form of the low refractive index member may have a thickness dimension which is of the same order as the other dimensions. An appropriate form of the transparent member and an appropriate material for the transparent member may be selected depending on the application of the substrate for the light emitting device or the light emitting device itself.

Further, in any one of the embodiments of any one of the aspect as described above, the electrically conductive transparent film is made of at least one material selected from the group consisting of indium-tin oxide (ITO), indium-zinc oxide, zinc-aluminum oxide, gold, silver, copper and chromium. The form of the electrically conductive transparent film is a layer and particularly a thin layer. An appropriate thickness of the electrically conductive transparent film and an appropriate material for the electrically conductive transparent film may be selected depending on the application of the substrate for the light emitting device or the light emitting device itself.

BRIEF DESCRIPTION OF THE DRAWINGS

FIG. 3 schematically shows cross sectional views of examples of concrete embodiments of light emitting devices according to the present invention wherein FIG. 3(a) shows an example having no transparent member while

FIG. 4 schematically shows cross sectional views of examples of concrete embodiments of other light emitting devices according to the present invention wherein FIG. 4(a) shows an example having no transparent member while

FIG. 5 schematically shows cross sectional views of examples of concrete embodiments of further light emitting devices according to the present invention wherein FIG. 5(a) shows an example having no transparent member while

shows an example using the plane light emitting device according to FIG. 6 while wherein

FIG. 9 schematically shows cross sectional views of examples of concrete embodiments of plasma displays according to the present invention wherein FIG. 9(a) shows an example using the plane light emitting device according to FIG. 6 while wherein

CONCRETE EMBODIMENTS OF THE INVENTION

Concrete embodiments of the present invention will be hereinafter explained below.

Figure 1:
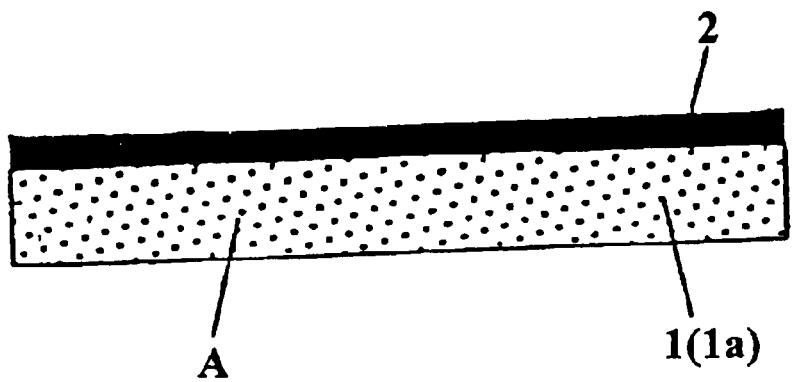
FIG. 1 schematically shows a cross sectional view of one example of a concrete embodiment of a substrate for a light emitting device according to the present invention.

FIG. 1 shows one example of a concrete embodiment of the substrate for the light emitting device (A) according to the present invention, and the substrate is formed to have a construction in which an electrically conductive transparent layer 2 is laminated on one surface of a low refractive index member 1. The low refractive index member 1 is so prepared in a plane form that it has a refractive index in the range between 1.003 and 1.300. When the refractive index is greater than 1.300, it becomes difficult to produce a light emitting device of which light external efficiency ($\eta$) is high. It is better that the refractive index of the low refractive index member 1 is smaller. However, there is a limitation to prepare a material (including the silica aerogel) having the lower refractive index, and it is not industrially easy to prepare the material for the low refractive index member of which refractive index is smaller than 1.003.

The thickness of the low refractive index member 1 is not particularly limited, and it is preferably greater than 1 $\mu$m, and more preferably in the range between 1 $\mu$m and 100 $\mu$m. Generally, when the thickness of the low refractive index member 1 is greater than 2 mm, there is not so remarkable improvement as to the external efficiency so that such a thicker low refractive index member is not so effective. It is noted that the thickness of the low refractive index may be in the form of a thin film when the transparent member is present, while the low refractive index member is preferably thicker when the transparent member is absent.

Generally, a refractive index of a solid material which is made of an uniform simple substance or compound is not smaller than 1.3, and a material of which refractive index is smaller than 1.3 is necessarily a porous material. By the way, it is general that even when solid portions of a porous material is formed from a water-clear material, light scattering by means of the porous structure occurs so that the porous material looks whitely cloudy.

The low refractive index member according to the present invention means a finely porous member which has a light transparency by means of having an appropriate fine porous structure which suppresses the light scattering due to the porous structure as described above. Such low refractive index member may be made of a material such as a silica, a transparent resin (for example, a melamine resin or a methacrylic resin) or the like which keeps a uniform porous structure.

The low refractive index member made of the silica is a transparent porous member made of a material which is produced for example by drying a wet gel material which is prepared by pH adjustment of a sodium silicate aqueous solution or hydrolysis and polymerization reaction of an alkoxysilane to form a solidified wet gel material. Among the materials produced as described, a material which has a particularly high porosity is called a silica aerogel. Usually, the silica aerogel is obtained by a supercritical drying of a gel material in a wet condition.

For example, even when a sodium silicate aqueous solution is used as a starting material as in U.S. Pat. Nos. 5,137,927 or 5,124,364, or an alkoxysilane is used as a starting material as in U.S. Pat. Nos. 4,402,927, 4,432,956 or 4,610,863, the silica aerogel is obtained by the supercritical drying process.

Concretely, according to U.S. Pat. Nos. 4,402,927, 4,432,956 or 4,610,863 a gel compound having a silica framework in a wet state which is prepared by the hydrolysis followed by polymerization of the alkoxysilane (or silicon alkoxide or alkyl silicate) is dried by the supercritical drying in the presence of a solvent (or dispersion medium) such as an alcohol or carbon dioxide under supercritical conditions exceeding a critical point of the solvent.

For example, the supercritical drying may be carried out by dipping the obtained wet gel material in liquefied carbon dioxide as the dispersion medium so that a medium which the gel material contains therein is replaced with the liquefied carbon dioxide beforehand, followed by drying through supercritical conditions of carbon dioxide, or by subjecting the obtained wet gel material to the supercritical conditions of carbon dioxide in the presence of carbon dioxide and the medium which the gel material contains therein so that the medium is extracted from the gel material by carbon dioxide, followed by drying.

Recently, Japanese Patent Kohyo Publication Nos. 8-504674 and 10-508569 have described that a porous silica of which porosity is similar to that of the silica prepared by the supercritical drying is produced by drying at conditions even below the supercritical conditions. Therefore, some of gel materials called xerogel may be used for the low refractive index member, and the structure of such gel material is not so different from that of the aerogel material.

In any case of the present invention, the low refractive index member is a porous member of which porosity is at least about 40%, preferably at least about 60% and more preferably at least about 80%. As to such a low refractive index member, it is preferable that a hydrophobic treatment of the silica aerogel which makes the silica aerogel hydrophobic as described in U.S. Pat. No. 5,830,387 is carried out, and the porous structure of the silica thus treated can be kept for an extended period. It is noted that the larger porosity of the low refractive index member is better in the present invention, but it is technically not easy for the porosity of the low refractive index member to exceed 99.5%.

The low refractive index member made of such as a melamine resin, a methacrylic resin or the like is a porous member of the transparent resin. For example, the following may be exemplified: a porous member which is obtained by formation of a wet gel of the melamine resin followed by the supercritical drying as described in U.S. Pat. No. 5,086,085; and a porous material of a polymethylmethacrylate resin which is obtained by preparation of a resin mixture of a polystyrene resin and a polymethylmethacrylate resin and then selectively removing the polystyrene resin by means of its dissolution as described in a technical reference "SCIENCE, Vol. 283, 1999, p 520". These are only examples, and in any case of the porous member, the low refractive index member which is used in the present invention is a porous member of which porosity is at least about 40%, preferably at least about 60% and more preferably at least about 80%.

As described above, the xerogel material or the gel material of the resin which may be used in the present invention is a porous material of which porosity is as large as that of the aerogel material. Therefore, in this sense, the aerogel material in the present invention includes also the xerogel material and the gel material of the resin.

Among the materials for the low refractive index, the aerogel which is obtained by the supercritical drying is preferable since it is easy to produce a porous member as the low refractive index having a lower refractive index of which porosity is not less than 90%. Further when considering steps in the present invention such as the formation of the luminous layer and the formation of the electrically conductive transparent film, the silica aerogel is the most preferable.

It is to be noted that the U.S. Patents, the Japanese Patent Publications and the technical reference referred in the above are incorporated in the present specification with references thereto.

As described above, the silica aerogel is used as the best material for the low refractive index member 1. Since the silica aerogel is transparent and it has a refractive index which is close to that of air, the light external efficiency (η) obtained according to the equation (2) described above can be increased to nearly 1(100%) when the silica aerogel is used.

It is preferable that the gel material which is obtained by the hydrolysis and polymerization of the alkoxysilane as described above is subjected to the hydrophobic treatment according to Japanese Patent Kokai Publications Nos. 5-279011 and 7-138375 so as to confer the hydrophobic property to the gel material. These Publications are also incorporated in the present specification with references thereto. It is difficult for moisture or water to go into the inside of the silica aerogel material to which the hydrophobic property is thus given, so that degradations of the refractive index, the light transparency and so on of the silica aerogel is prevented.

The hydrophobic treatment may be carried out before or during the gel material is dried. It is carried out by reacting hydroxyl groups of silanol groups (which are on the surface of the gel material with hydrophobic groups of an agent for the hydrophobic treatment so that the hydroxyl groups are replaced with the hydrophobic groups. Concretely, for example, the gel material is dipped into a hydrophobic treatment solution comprising a solvent in which the hydrophobic treatment agent has been dissolved followed by heating if necessary so as to carry out the reaction to replace with the hydrophobic groups.

As the solvent which is used for the hydrophobic treatment, methanol, ethanol, isopropanol, xylene, toluene, benzene, N,N-dimethylformamide, hexamethyldisiloxane and the like may be exemplified. There is no particular limitation as to the solvent as long as the solvent easily dissolves the agent for the hydrophobic treatment and is able to replaced the medium that the gel material contains before the hydrophobic treatment. In addition, when the supercritical drying is carried out later on, a solvent with which the supercritical drying is easily performed is preferable, and preferable examples of the solvent are methanol, ethanol, isopropanol, liquefied carbon dioxide and other material with which those listed materials is able to be replaced.

As the hydrophobic treatment agent, for example hexamethyldisilazane, hexamethyldisiloxane, trimethylmethoxysilane, dimethyldimethoxysilane, methyltrimethoxysilane, ethyltrimethoxysilane, trimethylethoxysilane, dimetyldiethoxysilane, and metyltriethoxysilane and so on are exemplified.

The refractive index of the silica aerogel prepared as described above may be adjust to a certain value in the range greater than 1 and not larger than 1.3 according to the known art. For example, the refractive index may be freely changed depending on a compounding ratio of starting materials for the formation of the gel material. In order to ensure the performances of the silica aerogel such as its transparency, it is preferable that the refractive index is adjusted to a value in the range between 1.008 and 1.18.

The electrically conductive (and) transparent film 2 which is formed on the surface of the low refractive index member 1 made of the silica aerogel 1a may be formed from indium-tin oxide (ITO), indium-zinc oxide, zinc-aluminum oxide, gold, silver, copper, chromium or the like. Indium-tin-oxide is particularly preferable from viewpoints of its transparency, its sheet resistance (which is a measure to indicate a surface conductivity of the electrically conductive transparent film) and a work function. The thickness of the electrically conductive transparent film 2 is preferable in the range between about 50 nm and 400 nm in order to ensure an appropriate sheet resistance and an appropriate transparency. A manner to form the electrically conductive transparent film 2 on the surface of the low refractive index member 1 is not particularly limited, and any well-know manner such as coating the surface of the low refractive index member 1 with a dispersion containing a material such as ITO or sputtering such a material onto the low refractive index member 1 may be used.

Figure 2:
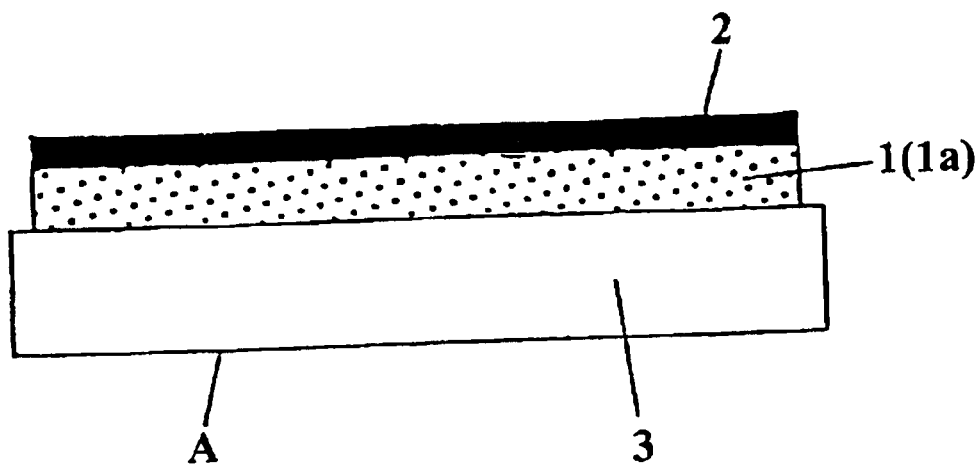
FIG. 2 schematically shows a cross sectional view of one example of a concrete embodiment of another substrate for a light emitting device according to the present invention.

FIG. 2 shows another example of a concrete embodiment of the substrate for the light emitting device (A) according to the present invention wherein an electrically conductive transparent film 2 is formed on one of two surfaces of the low refractive index member 1 made of the silica aerogel 1a while a transparent member 3 is placed on the other surface of the two surfaces. The transparent member 3 provides the substrate for the light emitting device with the strength. The thickness of the transparent member 3 is not particularly limited and it is sufficient that the thickness ensures the strength.

Even though the transparent member 3 is adjacent to the low refractive index member 1 as in the concrete embodiment shown in FIG. 2, the external efficiency (η) of the light withdrawn outside is not greatly reduced since the refractive index of the low refractive index member 1 has a refractive index which is close to 1. That is, those skilled in the art will understand according to the laws of refraction of the classical optics that most of emitted light is withdrawn into the ambient air when the generated light first goes into and through the low refractive index member 1 of which refractive index is close to 1 and of which thickness in not smaller than 1.0 μm and then goes into and through the transparent member 3 of which refractive index is far larger than 1 followed by going into the ambient air.

For the transparent member 3, a transparent resin such as an acrylic resin, a polycarbonate (PC) resin, a polyester resin and a polyethylene terephthalate (PET) resin may be used in addition to the glass. Any appropriate manner may be used for laminating (or stacking) the transparent member 3 and the low refractive index member 1 made of the silica aerogel 1a. For example, during the sol-gel processing stage to form the silica aerogel, a manner may be employed in which the alkoxysilane solution is applied onto the surface of the transparent member 3 by means of the dip-coating method or the spin-coating method. The thickness of the low refractive index member made of the silica aerogel is not particularly limited.

Next, the light emitting device comprising the luminous layer and the substrate for the light emitting device (A) as described above.

FIG. 3 shows examples of constructions of the light emitting devices according to the present invention, each of which comprises an organic EL layer as the luminous layer. The substrate for the light emitting device (A) as shown in FIG. 1 or 2 has the organic EL layer 4a as the luminous layer 4 on a surface of the electrically conductive transparent film 2 which surface is opposite to the surface having the low refractive index member 1, and a back electrode 14 is placed on a surface of the organic EL layer 4a which surface is opposite to the surface having the electrically conductive transparent film 2. The organic EL layer 4a may be formed from an organic EL material (such as a low molecular weight dye material or a conjugated polymer material) which is generally used in the art.

Figure 3A:
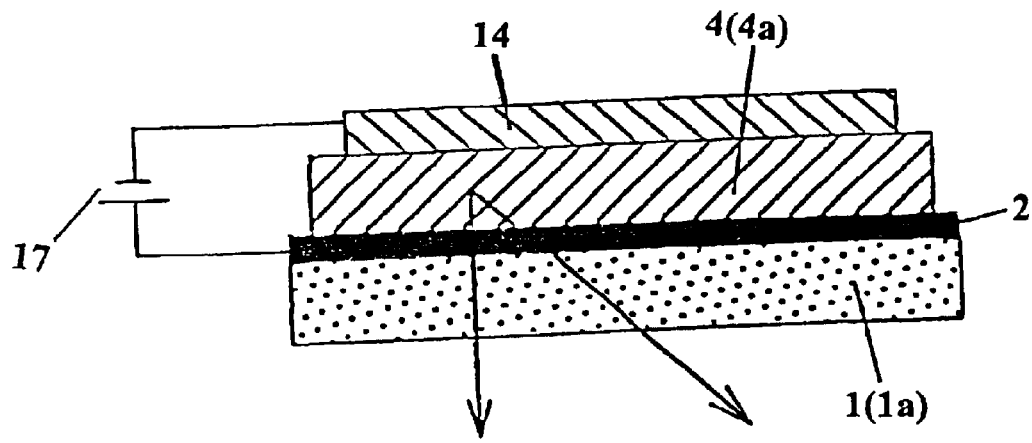
Figure 3B:
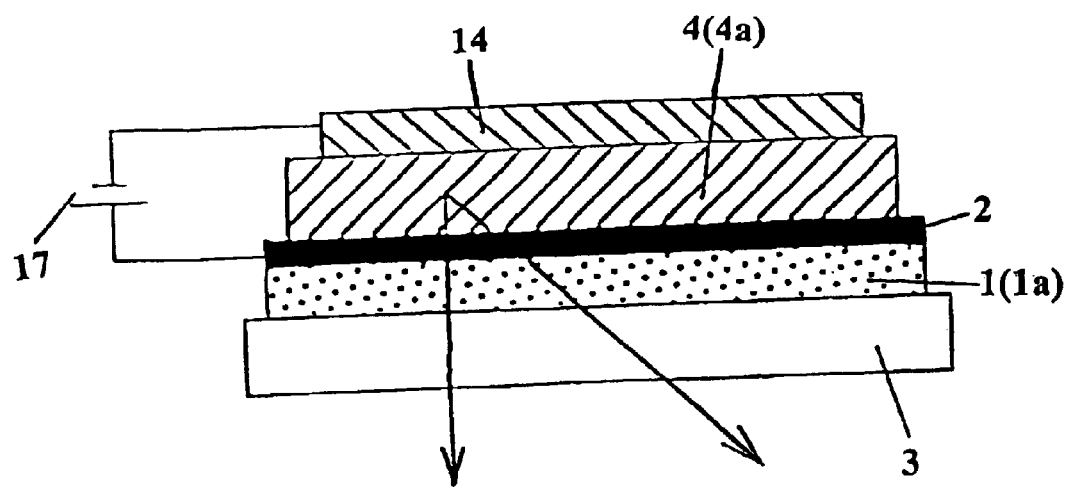
FIG. 3(b) shows an example having a transparent member.

Further, the organic EL layer 4a may be a multi-layer laminate comprising a plurality of layers such as a hole injection layer, a hole transfer layer, an electron injection layer, an electron transfer layer and so on. For the back electrode 14, a metal such as aluminum, silver-magnesium, calcium and so on may be used. FIG. 3(a) shows an organic EL light emitting device not having a transparent member 3 on the low refractive index member 1 while FIG. 3(b) shows an organic EL light emitting device having the transparent member 3 on the low refractive index member 1.

With the organic EL light emitting device as described above, a direct current supply 17 is connected to the electrically conductive transparent film 2 and the back electrode (or back plate) 14, and when an electric field is applied across the organic EL layer 4a, light emission occurs in the organic EL layer 4a. As shown in FIG. 3 with arrows, the light which generates in the organic EL layer 4a passes through the electrically conductive transparent film 2 and the low refractive index member 1 directly or after being reflected by the back electrode 14, and goes into the ambient air provided that in the case of FIG. 3(b) the light goes into the ambient air after further passing through the transparent member 3. Since the low refractive index member 1 made of for example the silica aerogel 1a has the refractive index which is very close to 1, the external efficiency of the withdrawn light ($\eta$) is increased as calculated by the above equation (2). It is noted that although there is the electrically conductive transparent film 2 between the organic EL layer 4a and the low refractive index member 1, the thickness of the electrically conductive transparent film 2 does not substantially affect the external efficiency of the withdrawn light ($\eta$) since the thickness of the electrically conductive transparent film is smaller than the wavelength of the light.

Figure 4A:
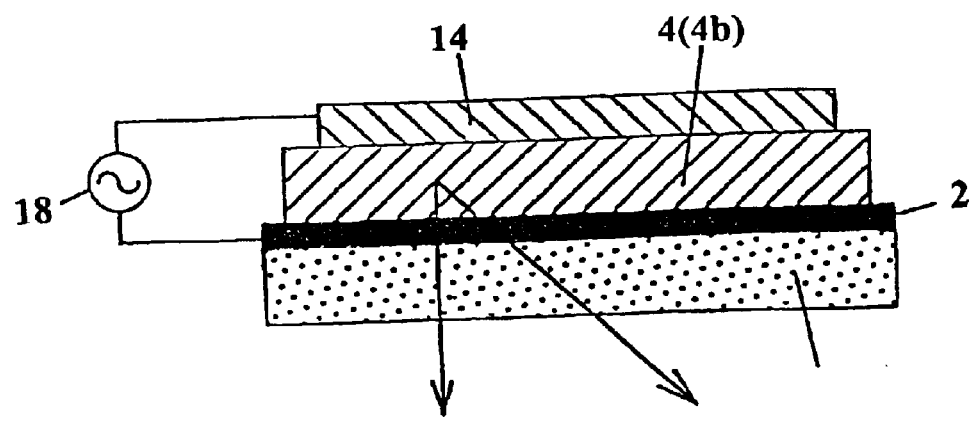
Figure 4B:
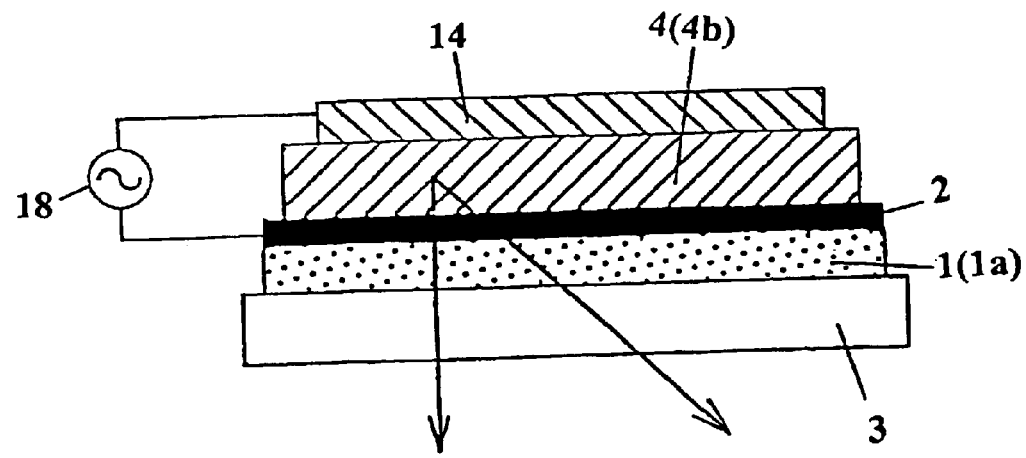
FIG. 4(b) shows an example having a transparent member.

FIG. 4 shows examples of constructions of the light emitting devices according to the present invention each of which comprises an inorganic EL layer as the luminous layer. The substrate for the light emitting device (A) as shown in FIG. 1 or 2 has the inorganic EL layer 4b as the luminous layer 4 on a surface of the electrically conductive transparent film 2 which surface is opposite to the surface having the low refractive index member 1, and a back electrode 14 is placed on a surface of the inorganic EL layer 4a which surface is opposite to the surface having the electrically conductive transparent film 2. The inorganic EL layer may be formed from an inorganic fluorescent material which is not particularly limited as far as it is generally used in the art as an inorganic EL material. It is preferable that an insulation layer is formed on a surface and particularly each surface of the inorganic EL layer 4b. Concretely, an insulation layer made of a material having a high dielectric constant is formed between the electrode 14 and the luminous layer 4 and/or between the electrically conductive transparent film 2 and the luminous layer 4. The insulation layer depends on a material therefor, and generally it is made of a material having the high dielectric constant such as $Y_2O_3$, $SiO_2$ or the like may be used. FIG. 4(a) shows an inorganic EL light emitting device not having a transparent member 3 on the low refractive index member 1 while FIG. 4(b) shows an inorganic EL light emitting device having the transparent member 3 on the low refractive index member 1.

With the inorganic EL light emitting device as described above, an alternating current supply 18 is connected to the electrically conductive transparent film 2 and the back electrode 14, and when an electric field is applied across the inorganic EL layer 4b, light emission occurs in the inorganic EL layer 4b. As shown in FIG. 4 with arrows, the light which generates in the inorganic EL layer 4b passes through the electrically conductive transparent film 2 and the low refractive index member 1 directly or after being reflected by the back electrode 14, and goes into the ambient air provided that in the case of FIG. 4(b) the light goes into the ambient air after further passing through the transparent member 3. Since the low refractive index member 1 made of for example the silica aerogel 1a has the refractive index which is very close to 1, the external efficiency of the withdrawn light ($\eta$) is increased as calculated by the above equation (2).

Figure 5A:
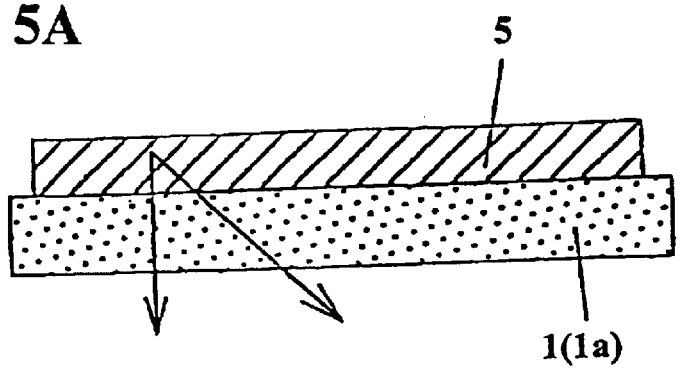
Figure 5B:
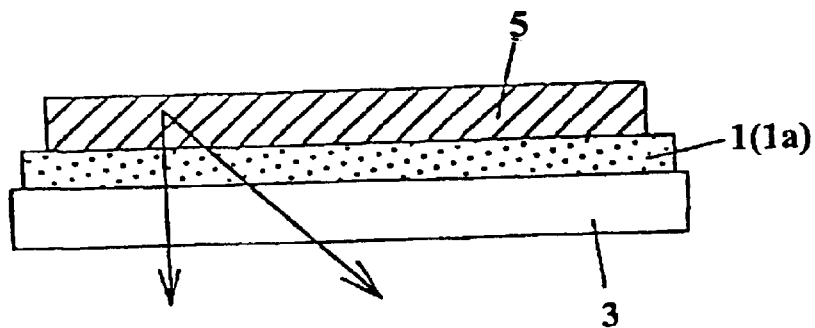
FIG. 5(b) shows an example having a transparent member.

FIG. 5 shows examples of constructions of other light emitting devices according to the present invention in which a luminous layer 5 such as a PL luminous layer 5 is placed on a surface of a low refractive index member 1 made of the silica aerogel 1a. When the luminous layer 5 is the PL luminous layer, it is made of a luminescent material which emits light by means of photo as energy. The luminescent material is not particularly limited, and an inorganic material, an organic material a rare earth metal complex or the like may be used as long as it has a photoluminescent property. FIG. 5(a) shows a light emitting device not having a transparent member 3 on the low refractive index member 1 while FIG. 5(b) shows a light emitting device having the transparent member 3 on the low refractive index member 1.

When the light emitting device has the PL luminous layer 5 as described above, electrodes required for the application of an electric field are not necessary since it emits light by means of photo as energy, and the PL light emitting device is so constructed that the low refractive index member 1 is formed as a member which carries the PL luminous layer 5.

As shown in FIG. 5 with arrows, the light which generates in the PL layer 5 passes through the low refractive index 1 and the transparent member 3, and goes into the ambient. Since the low refractive index member 1 made of for example the silica aerogel 1a has the refractive index which is very close to 1, the external efficiency of the withdrawn light ($\eta$) is increased as calculated by the above equation (2), so that a PL device having an excellent external efficiency ($\eta$) is obtained.

Figure 6:
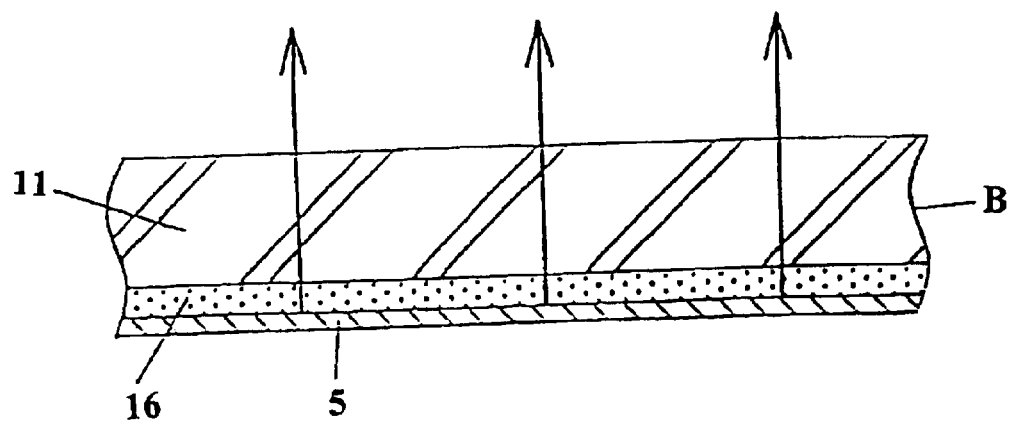
FIG. 6 schematically shows a cross sectional view of an example of concrete embodiment of a plane light emitting device according to the present invention.

FIG. 6 shows one example of a plane light emitting device which is formed using the PL device shown in FIG. 5(b), in which a glass plate 11 is used as the transparent member 3, a silica aerogel thin film 16 as the low refractive index member 1 is laminated on one surface of the glass plate 11, and a PL luminous layer 5 is placed on the surface of the silica aerogel thin film 16. The formation of the silica aerogel thin film 16 on the surface of the glass plate 11 is carried out by applying an alkoxysilane solution is applied onto the surface of the glass plate 11 by means of the dip-coating method or the spin-coating method followed by drying during the sol-gel processing stage to form the silica aerogel.

The PL luminous layer 5 may be formed from the PL material as described above. The luminous layer uses an inorganic fluorescent material, which mainly includes $Y_2O_3$:Eu (red), $LaPO_4$:Ce, Tb (green) or $BaMgAl_{10}O_{17}$:Eu (blue), and the like. An appropriate inorganic fluorescent material is selected depending on an intended color of light or a wavelength of an ultraviolet ray which is irradiated. Further, the PL luminous layer 5 may be formed from a material such as a low molecular weight dye material or a conjugated polymer material which is generally used for the organic EL luminous layer in the art. The formation of the PL luminous layer 5 on the silica aerogel thin film 16 may be carried out by forming a layer of a fluorescent material by means of for example the printing method, the sputtering method or the like.

The printing method is carried out by for example mixing a fluorescent material, an optional polymer and water so as to prepare a slurry and applying the slurry onto a surface of the silica aerogel thin film 16 followed by drying and firing at a high temperature not lower than 500° C. The slurry may be a water-based slurry or an organic-based slurry.

In the case of the organic-based slurry, a slurry prepared by dispersing a fluorescent material such as $Y_2O_3$:Eu and a binding agent in an organic solvent is applied onto the surface of the glass plate 11 followed by firing at a temperature between 500° C. and 600° C. so as to remove the solvent, whereby the PL luminous layer 5 is formed.

In the case of the water-based slurry, a slurry prepared by dispersing a fluorescent material such as $Y_2O_3$:Eu and a binding agent in a solution which contains a thickener, pure water and a surfactant is applied onto the surface of the glass plate 11 followed by firing at a temperature between 500° C. and 600° C. so as to remove water, and the thickener, whereby the PL luminous layer 5 is formed. The binding agent improves binding force of the fluorescent material, and for example an alumina sol may be used as the binding agent.

The sputtering method may be carried out under the conditions of an output power in the range between 100 W and 300 W, a temperature in the range between 200° C. and 400° C., and a degree of vacuum in the range between about 0.7 Pa and 1 Pa.

The thickness of the PL layer 5 is not particularly limited, and it is preferably in the range between about 0.1 μm and 500 μm when it is formed by the printing method. The thickness of the PL layer 5 which is formed by the sputtering method is preferably in the range between about 0.05 μm and 1 μm, and the smaller thickness is better. The thickness is appropriately selected depending on a required light quantity.

Upon the formation of the PL luminous layer 5 on the surface of the silica aerogel thin film 16, the fluorescent material of the PL luminous layer 5 penetrates into a portion of the surface of the silica aerogel thin film 16 to provide an anchor effect, so that the PL luminous layer 5 is laminated on the silica aerogel thin layer 16 with a strong bonding force, whereby the PL luminous layer 5 is attached to the glass plate 11 strongly through the silica aerogel thin film 16.

When an ultraviolet ray is irradiated onto the PL luminous layer 5 in the plane light emitting device formed as described above, the PL luminous layer 5 emits light by being excited by the ultraviolet ray. The light generated in the PL luminous layer 5 is injected into the glass plate 11 through the silica aerogel thin layer 16 and ejects outside from a surface of the glass plate 11. Since the silica aerogel thin film 16 of which refractive index is close to 1 is provided between the PL luminous layer 5 and the glass plate 11, the light generated in the luminous layer 5 goes into the glass plate 11 at a small incident angle and then goes out of the surface of the glass plate 11, so that a ratio of the light quantity which is lost as the guided wave is reduced and a ratio of the light quantity which is withdrawn into the air from the surface of the glass plate 11 is increased, whereby the luminance of the surface of the plane light emitting device is increased.

Figure 7:
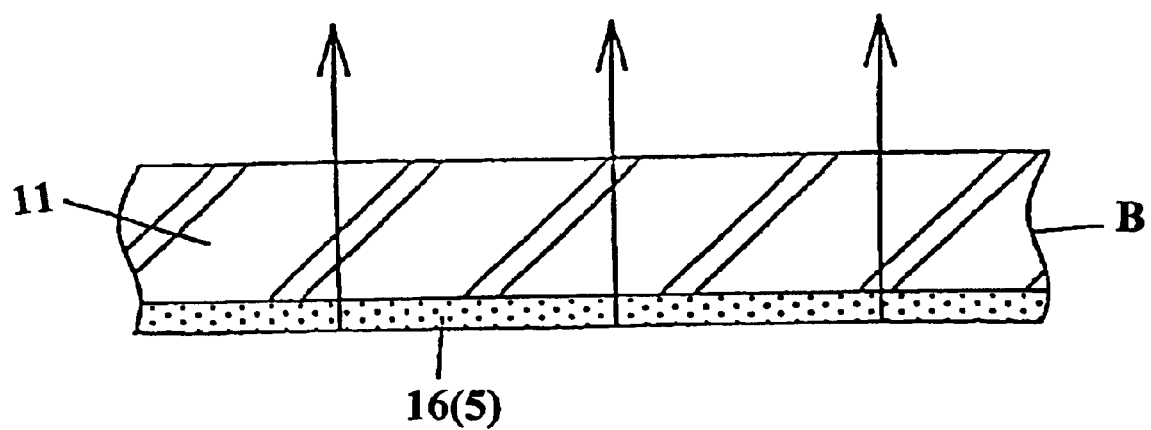
FIG. 7 schematically shows a cross sectional view of an example of concrete embodiment of another plane light emitting device according to the present invention.

In the concrete embodiment shown in FIG. 6, the PL layer 5 and the silica aerogel thin film 16 are formed as separate two layers, while in the concrete embodiment shown in FIG. 7, one layer which has both functions of the PL luminous layer 5 and the silica aerogel thin film 16 is provided by forming a luminous layer 5 by means of a silica aerogel thin film 16 in which particles of the fluorescent material are dispersed or which carries such particles. The silica aerogel thin film 16 in which the particles of the fluorescent material are dispersed or which carries such particles is formed by preparing an alkoxysilane slurry in which the fine particles of the fluorescent material are dispersed and then coating the alkoxysilane slurry on the surface of the glass plate 11 in any one of the coating manners as described above followed by drying.

A mixing ratio of the particles of the fluorescent material in the alkoxysilane slurry is preferably in the range between about 10% and 60% by volume based on the total volume of the alkoxysilane slurry, and a diameter of the particles of the fluorescent material is not particularly limited but preferably in the range between about 0.1 μm and 100 μm, and finer is better. With the slurry, the particles of the fluorescent material are uniformly and densely dispersed in the silica aerogel, and the silica aerogel functions as a binder to tightly adhere to the glass plate 11. When firing is carried out optionally after drying, the tight adhesion is further improved.

When an ultraviolet ray is irradiated on to the silica aerogel thin film 16 in the plane light emitting device formed as described above, the particles of the fluorescent material in the silica aerogel thin layer 16 are excited by the ultraviolet ray to generate light. The light generated in the silica aerogel thin film 16 is injected into the glass plate 11 and ejects from the surface of the glass plate 11. Since the light goes into the glass plate 11 from the silica aerogel thin film 16 of which refractive index is close to 1 at a small incidental angle and goes out of the surface of the glass plate 11, so that a ratio of the light quantity which is lost as the guided wave is reduced and a ratio of the light quantity withdrawn from the surface of the glass plate 11 is increased, whereby the luminance of the surface of the plane light emitting device is increased.

Figure 8A:
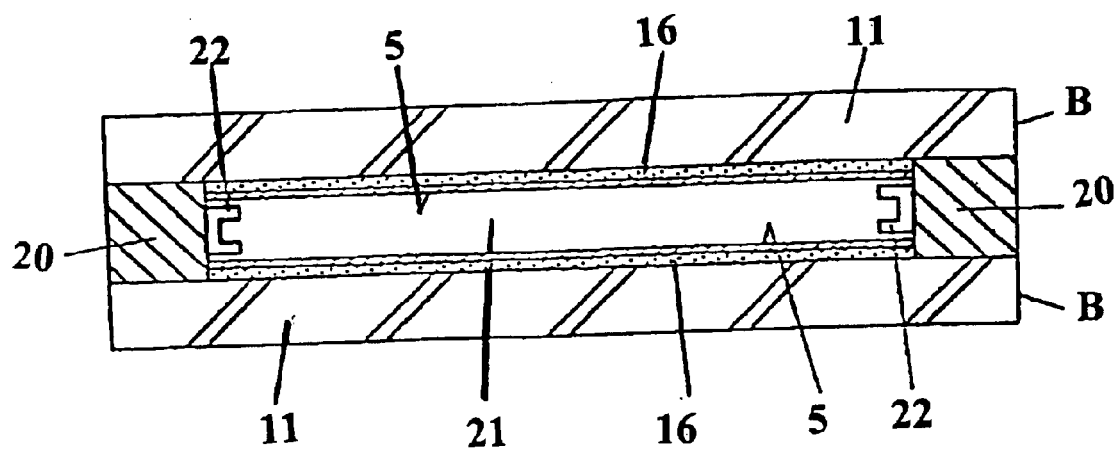
FIG. 8 schematically shows cross sectional views of examples of concrete embodiments of plane fluorescent lamps according to the present invention wherein FIG. 8(a)
FIG. 8(b) shows an example using the plane light emitting device according to FIG. 7.
Figure 8B:
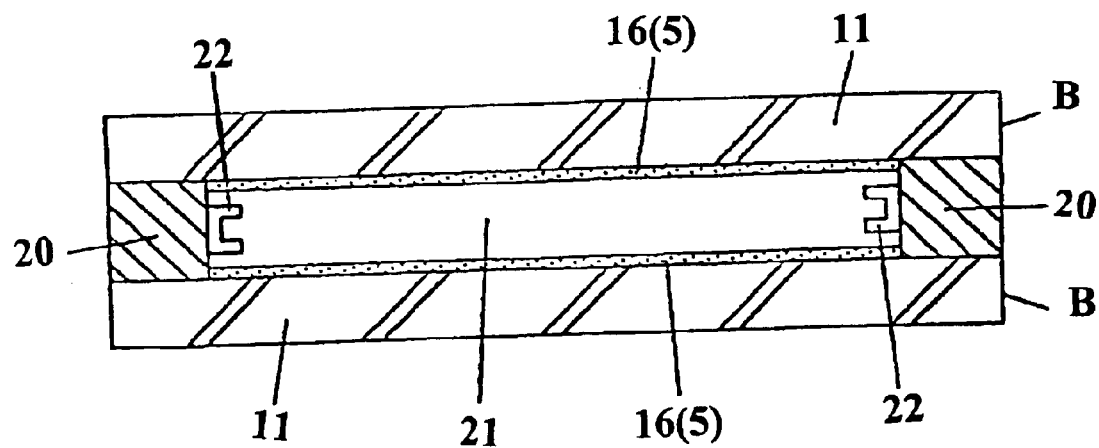

The plane light emitting device (B) formed as described above may be used as a light emitting plane for a plane fluorescent lamp. FIGS. 8(a) and 8(b) show examples of the plane fluorescent lamp in which the plane light emitting devices (B) shown in FIGS. 6 and 7 are used respectively wherein two plane light emitting devices (B) are so placed in parallel that their sides on which the PL luminous layer 5 and the silica aerogel thin film 16 are opposed to each other, and sealing members 20 are placed around the plane light emitting devices (B), whereby a closed space 21 is formed which is defined by the two plane light emitting devices (B) and the sealing members 20. In the closed space 21, there is provided a pair of discharge electrodes 22. Marcury, or an inert gas such as Xe, Ne or Kr or any gas combination thereof is enclosed.

With the plane fluorescent lamp formed as described above, when a voltage is applied between the discharge electrodes 22 so as to generate glow discharge, plasma is formed by means of thermal electrons ejected from a discharge electrode 22 and an ultraviolet ray is generated from mercury or the inert gas in the plasma. A wavelength of the ultraviolet ray depends on an excited substance, and it is for example, 185 nm and 254 nm. When such an ultraviolet ray is irradiated onto the fluorescent material in the PL luminous layer 5 (in the case of FIG. 8(a)) or in the silica aerogel thin film 16 (in the case of FIG. 8(b)) of the plane light emitting device (B), the fluorescent material is excited so as to generate visible light, whereby the plane light emitting device (B) emits light to function as a lamp. For a compact plane fluorescent lamp, mercury is not used, and it is preferable that a vacuum ultraviolet ray (of which wavelength is 147 nm) which is generated by means of discharge of the inert gas makes the fluorescent material generate light. Thus, in this case, it is better to use a fluorescent material of which excitation sensitivity to the ultraviolet ray is high.

Figure 9A:
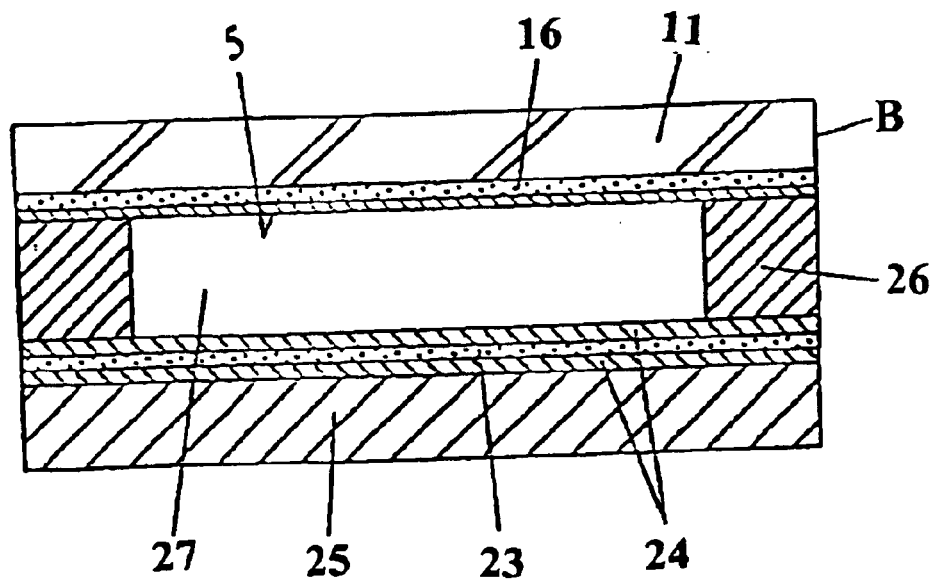
Figure 9B:
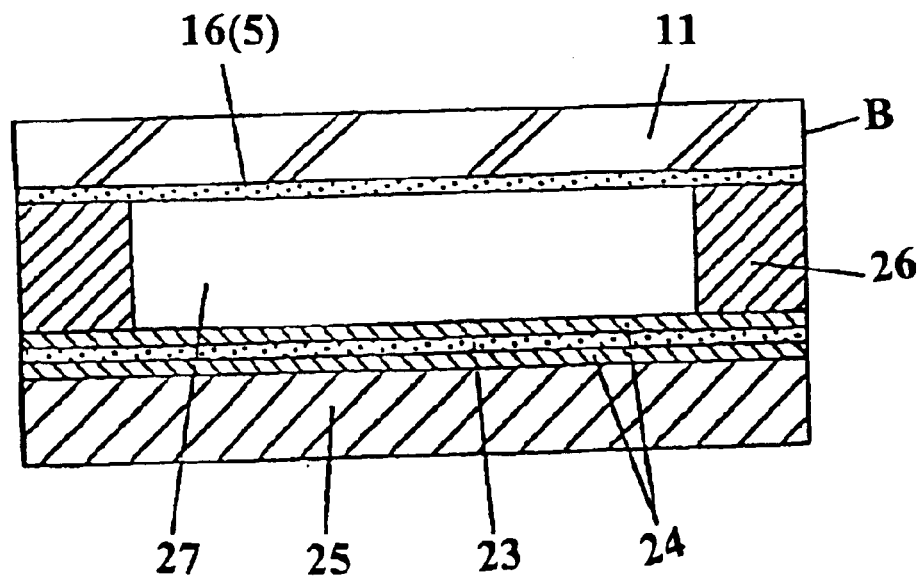
FIG. 9(b) shows an example using the plane light emitting device according to FIG. 7.

The plane light emitting device B formed as described above may be used as a light emitting plane for a plasma display. FIGS. 9(a) and 9(b) show examples of the plasma display in which the plane light emitting devices B shown in FIGS. 6 and 7 are used respectively wherein a surface of a substrate 25 on which surface a pair of electrodes 24 sandwiching the dielectric member 23 is located is spaced from a side of a plane light emitting device (B) on which side the PL luminous layer 5 and the silica aerogel thin film 16 are located so that the substrate 25 and the device B are placed separately in parallel. By providing partition members 26 around the substrate 25 and the light emitting device (B), a closed space 27 is formed which is defined by the plane light emitting device B, the substrate 25 and the partitions 26, and an inert gas such as Ne-Xe is enclosed in the space 27.

With the plasma display formed as described above, when a voltage is applied between the electrodes 24 so as to generate glow discharge, discharge plasma is formed by means of thermal electrons ejected from the electrode 24 and an ultraviolet ray is generated from the inert gas in the plasma. When such an ultraviolet ray is irradiated onto the fluorescent material in the PL luminous layer 5 of the plane light emitting device (in the case of FIG. 9(a)) or in the silica aerogel thin film 16 (in the case of FIG. 9(b)) of the plane light emitting device (B), the fluorescent material is excited so as to generate visible light, whereby the plane light emitting device (B) emits light to function as a plasma display.

EXAMPLES

Next, the present invention will be explained further concretely with reference to the following Examples.

Example 1

Solution A was prepared by mixing an oligomer of tetramethoxysilane (manufactured by Colcoat Co. Ltd, trade name "Methylsilicate 51") and methanol at a weight ratio of 47:81. Further, Solution B was prepared by mixing water, 28% by weight ammonia aqueous solution and methanol at a weight ratio of 50:1:81. Then, Solution A and Solution B were mixed at a weight ratio of 16:17 to form an alkoxysilane solution, which was dropped onto one side of a slide glass as a transparent member 3 of which thickness was 1.1 mm and refractive index was 1.46, followed by spin-coating at 700 r.p.m. for ten seconds. Then, after gelation of the alkoxysilane to produce a gel material on the glass, the glass was dipped into an aging solution which contained water, 28% by weight ammonia aqueous solution and methanol at a weight ratio of 162:4:640 to age the gel material for one day at room temperature.

Next, the slide glass having gel material in the form of a thin layer aged as described above was dipped in an isopropanol solution containing 10% by weight of hexamethyldisilazane so as to carried out the hydrophobic treatment. The slide glass as the transparent member 3 on which the gel material in the form of the thin layer was thus formed was dipped in isopropanol so as to wash the gel material. Then, the slide glass was placed in a autoclave, which was filled with liquefied carbon dioxide and then dried through supercritical conditions of 80° C. and 16 MPa, whereby a low refractive index member 1 made of a silica aerogel 1a of which thickness was 30 $\mu$m and refractive index was 1.03 was formed on the transparent member 3.

Then, a PL luminous layer 5 of which thickness was 50 nm was formed on a surface which was opposite to the surface of the low refractive index member 1 on which the transparent member 3 was formed so as to produce a PL device as the light emitting device as shown in FIG. 5(b). The luminous layer 5 was formed by the vacuum deposition of aluminum-quinolinol complex (tris(8-quinolinolate) aluminum manufactured by Dojindo Laboratories).

Comparative Example 1

A PL luminous layer 5 was formed on one surface of a slide glass as the transparent member 3 as in Example 1 without the formation of the low refractive index member 1 of the silica aerogel 1a.

Black light (ultraviolet ray) was irradiated onto the PL devices produced in Example 1 and Comparative Example 1, and fluorescent emission appearance of the devices were observed from the side of the transparent member 3. Results are shown in FIG. 10 wherein FIG. 10(a) is a photo of the PL device according to Example 1 while FIG. 10(b) is a photo of the PL device according to Comparative Example 1.

Figure 10A:
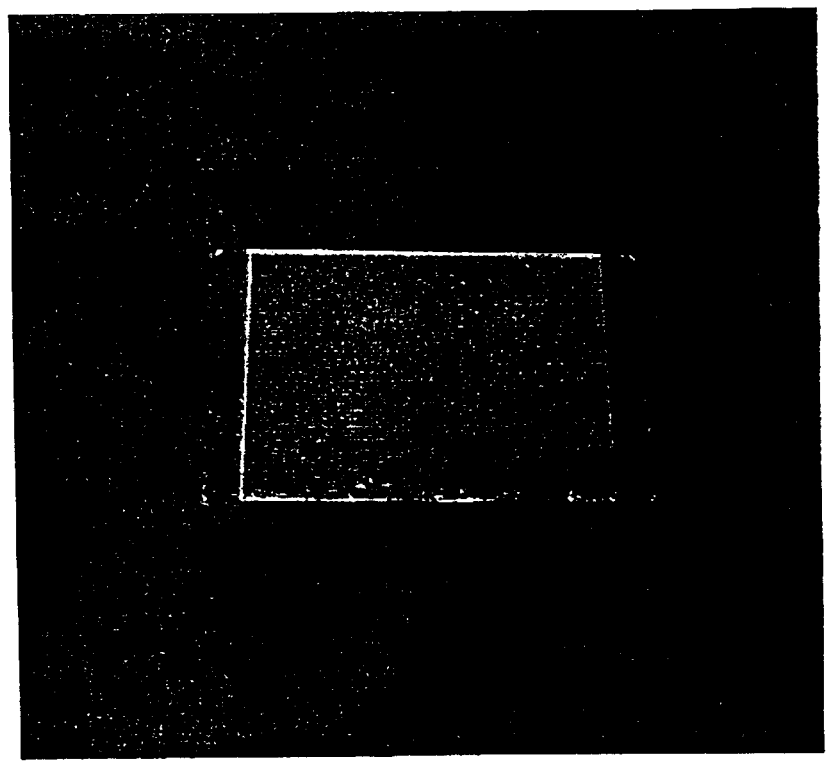
FIG. 10 shows copies of photos which show light emitting states of light emitting devices wherein FIG. 10(a) relates to the light emitting device of Example 1 while FIG. 10(b) relates to the light emitting device of Comparative Example 1.
Figure 10B:
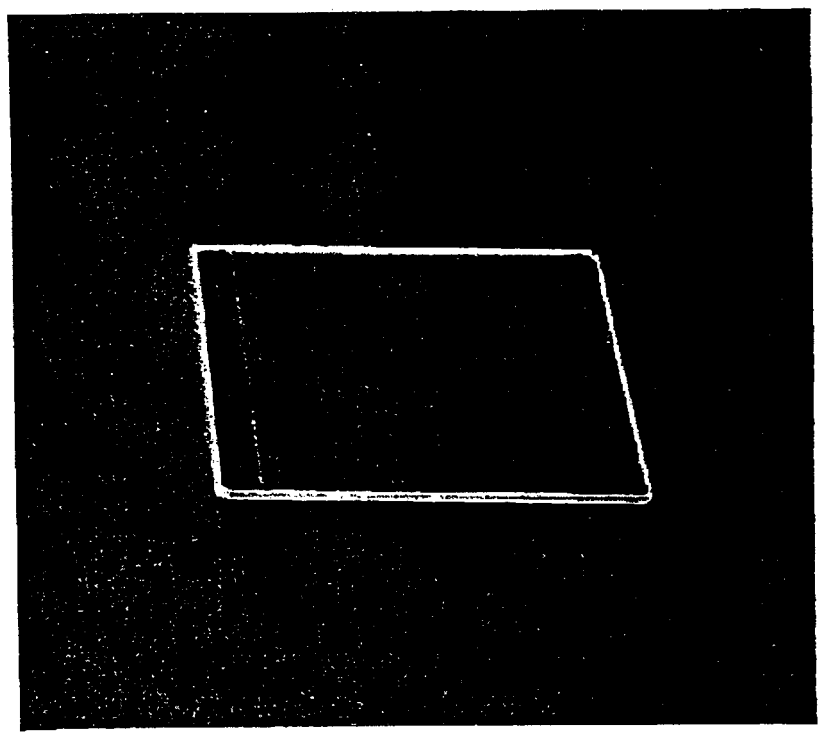
Figure 11:
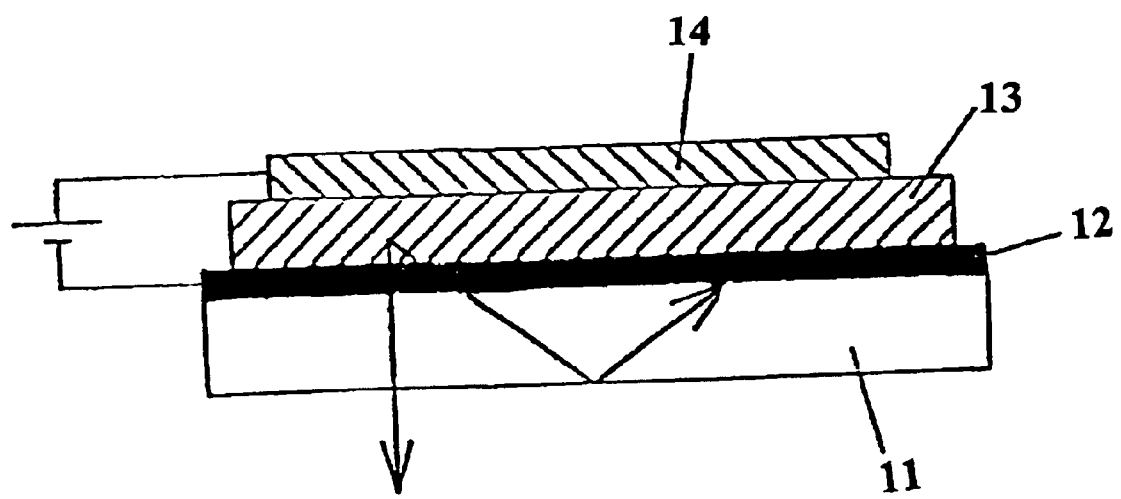
FIG. 11 schematically shows a cross sectional view of one example of a electroluminescent device of the prior art.
Figure 12:
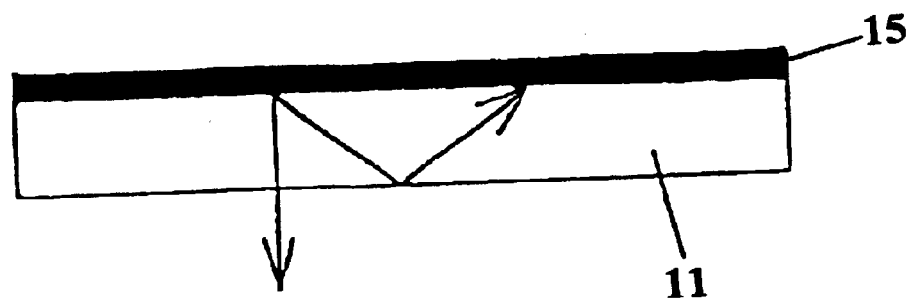
FIG. 12 schematically shows a cross sectional view of one example of a photoluminescent device of the prior art.

As seen from FIG. 10(a), with the device of Example 1, the fluorescence generated in the PL luminous layer 5 lights in a plane form while almost no light is lost as the guided wave from edges of the device. On the other hand, as seen from FIG. 10(b), edges of the device of Comparative Example lights strongly, and much light generated in the PL luminous layer 5 is lost as the guided wave from the edges.

Example 2

An alkoxysilane solution prepared as in Example 1 was poured in a container made of a styrol resin foam and the container was closed followed by leaving it at a room temperature so as to carry out the gelation of the alkoxysilane and aging of the resulted gel material. Then, the hydrophobic treatment and the supercritical drying were carried out as in Example 1, so that a low refractive index member 1 was made of a silica aerogel 1a of which refractive index was 1.03. The low refractive index member 1 had dimensions of 1 cm×1 cm×0.5 cm.

Then, an indium-tin oxide (ITO) film was formed on one surface of the low refractive index member 1 by the sputtering so as to form an electrically conductive transparent film 2, whereby a substrate for the light emitting device (A) of FIG. 1 was produced. The electrically conductive transparent film had a thickness of 300 nm.

Next, N,N'-diphenyl-N,N'-bis(3-methylphenyl)-1,1'-biphenyl-4,4'-diamine (manufactured by Dojindo Laboratories) was vacuum deposited with a thickness of 50 nm onto a surface of the electrically conductive transparent film 2 which surface is opposed to the surface which had the low refractive index member 1, and then aluminum-quinolinol complex (tris(8-hyroquinoline)aluminum manufactured by Dojindo Laboratories) was vacuum deposited with a thickness of 50 nm, so that an organic EL layer 4a having a hole transfer layer and a luminous layer. Further, aluminum was vacuum deposited with a thickness of 150 nm on the organic EL layer 4a so as to produce a back electrode 14, whereby an organic EL device as shown in FIG. 3(a) was produced.

Example 3

Using the spin coating method, a low refractive index member 1 having a thickness of 100 μm made of a silica aerogel 1a of which refractive index was 1.03 was formed on one surface of a transparent member 3 of a glass plate as in Example 1. The glass plate had a refractive index of 1.46 and its dimensions of 20 mm×20 mm×1.1 mm (thickness). A film of indium-tin oxide was formed on the low refractive index member 1 by the sputtering method so that an electrically conductive transparent film 2 having a thickness of 300 nm was formed, whereby a substrate for the light emitting device (A) as shown in FIG. 2 was produced.

Using the substrate for the light emitting device (A), an organic EL layer 4a and a back electrode 14 were formed as in Example 2 so that an organic EL device having a structure of FIG. 3(b).

Comparative Example 2

Example 2 was repeated so as to produce an organic EL device except that in place of the low refractive index member 1 of the silica aerogel 1a, a glass plate having a thickness of 1.1 mm and a refractive index of 1.46 was used.

Example 4

A substrate for the light emitting device (A) having a structure shown in FIG. 1 was produced as in Example 2.

Then, an insulation layer having a thickness of 0.4 μm was made of $Si_3N_4$ by the sputtering method on the surface of the electrically conductive transparent film 2 of the substrate for the light emitting device (A). A layer as an inorganic EL layer 4b made of ZnS:Mn (Mn concentration was 0.5% by weight) and having a thickness of 1.0 μm was made on the insulation layer by the electron beam vapor deposition method, and an insulation layer having a thickness of 0.4 μm was made of $Si_3N_4$ by the sputtering method on the inorganic EL layer 4b, whereby luminous layer 4 was formed on the electrically conductive transparent film 2. Aluminum was vacuum deposited with a thickness of 150 nm on the luminous layer 4, so that a back electrode 14 was formed, whereby an inorganic EL device having a structure of FIG. 4(a) was produced.

Example 5

A substrate for the light emitting device (A) having a structure shown in FIG. 2 was produced as in Example 3.

Using this substrate (A), an organic EL device comprising a transparent member 3 of which device structure was as shown in FIG. 4(b) was produced by providing a luminous layer 4 having an inorganic EL layer 4b and a back electrode 14 as in Example 4.

Comparative Example 3

Example 4 was repeated so as to produce an inorganic EL device except that in place of the low refractive index member 1 of the silica aerogel 1a, a glass plate having a thickness of 1.1 mm and a refractive index of 1.46 was used.

A direct current supply 17 (seven volts) was connected to the electrically conductive transparent film 2 and the back electrode 14 of each of the organic EL devices of Examples 2 and 3 and Comparative Example 2, and a luminance of the surface of the device was measured by a luminance meter (LS-110 manufactured by Minolta Co. Ltd.). The luminance was at an angle of 45° relative to a normal of the surface.

An alternating current supply 18 (100 V and 400 Hz) was connected to the electrically conductive transparent film 2 and the back electrode 14 of each of the inorganic EL devices of Examples 4 and 5 and Comparative Example 3, and a luminance of the surface of the device was measured by a luminance meter (LS-110 manufactured by Minolta Co. Ltd.). The luminance was at an angle of 45° relative to a normal of the surface.

The results are shown in Table 1 below:

TABLE 1

|  | luminance (cd/m$^2$) |
|---|---|
| Example 2 | 460 |
| Example 3 | 420 |
| Comparative Example 2 | 150 |
| Example 4 | 290 |
| Example 5 | 270 |
| Comparative Example 3 | 100 |

It is seen from Table 1 that the luminance of the light emitting device according to Example 2 or 3 is higher than that of Comparative Example 2, so that the external efficiency of the light is higher in the light emitting device of Example 2 or 3. In addition, the luminance of the light emitting device according to Example 4 or 5 is higher than that of Comparative Example 3, so that the external efficiency of the light is higher in the light emitting device of Example 4 or 5.

Example 6

A slurry containing a mixture of butyl acetate containing 2.0% by weight of cellulose nitrate (17.5 g) and butyl acetate (43.3 g) and a silica (1.5 g, manufactured by Degussa) as a thickener dispersed in the mixture was applied on a glass plate 11 of which refractive index was 1.46, and the slurry was dried so that a protection film was formed on a surface of the glass plate 11.

Solution A was prepared by mixing an oligomer of tetramethoxysilane (manufactured by Colcoat Co. Ltd. trade name "Methylsilicate 51") and methanol at a weight ratio of 47:81. Further, Solution B was prepared by mixing water, 28% by weight ammonia aqueous solution and methanol at a weight ratio of 50:1:81. Then, Solution A and Solution B were mixed at a weight ratio of 16:17 to form an alkoxysilane solution, which was dropped onto the protection film on the glass plate 11, which was placed in a rotation chamber of a spin coater, so that the alkoxysilane solution was spin-coated on the glass plate 11.

It is noted that a methanol atmosphere had been kept beforehand in the rotation chamber of the spin coater by charging methanol in the chamber beforehand. The glass plate 11 was rotated at 700 rpm for ten seconds. After thus spin-coating the alkoxysilane solution, the glass plate was left for three minutes so as to gelate the alkoxysilane to produce a gel material. Then, the glass plate having the gel material in the form of a thin film was dipped into an aging solution which contained water, 28% by weight ammonia aqueous solution and methanol at a weight ratio of 162:4:640 to age the gel material for one day at room temperature.

Next, the glass plate 11 on which the gel material in the form of the thin film was formed was dipped in isopropanol so as to wash the gel material. Then, the glass plate was placed in a autoclave, which was filled with liquefied carbon dioxide and then dried through supercritical conditions of 80° C., 16 MPa and two hours, whereby a silica aerogel thin film 16 of which thickness was 20 μm was laminated on the glass plate 11. Then, $Y_2O_3$:Eu (fluorescent material in the form of particles, 24 g), alumina sol as a binding agent (manufactured by Nissan Chemical Industries, Ltd. 12 mg) were dispersed in a mixture of 3.0% by weight polyethyleneoxide aqueous solution as a thickener (25 g), pure water (5 g) and 0.5% by weight surfactant aqueous solution (10 g) so as to form a slurry. The slurry was applied onto the silica aerogel thin film 16 of the glass plate 11, followed by firing at a temperature of 600° C. for ten minutes so as to remove. the solvent and the thickener, so that a PL luminous layer 5 having a thickness of 30 μm and comprising $Y_2O_3$:Eu was formed, whereby a plane light emitting device (B) having a structure shown in FIG. 6 was produced.

Example 7

A protection film and a silica aerogel thin film 16 were formed on a glass plate 11 as in Example 6. Then, a $Y_2O_3$:Eu film having a thickness of 100 nm was formed on the silica aerogel thin film 16 by sputtering at conditions of 400° C., 0.7 Pa and 200 W, whereby a plane light emitting device (B) having a structure shown in FIG. 6 was produced.

Example 8

Solution A was prepared by mixing an oligomer of tetramethoxysilane (manufactured by Colcoat Co. Ltd, trade name "Methylsilicate 51") and methanol at a weight ratio of 47:81. Further, Solution B was prepared by mixing water, 28% by weight ammonia aqueous solution and methanol at a weight ratio of 50:1:81. Then, $Y_2O_3$:Eu as a particular fluorescent material, Solution A and Solution B were mixed (agitation period of one minute) at a volume ratio of 40:29:31, so that an alkoxysilane solution in which the particles of the fluorescent material were dispersed. The alkoxysilane solution was dropped onto the protection film on the glass plate 11 followed by spin coating as in Example 1. Further, as in Example 1, gelation, aging and supercritical drying were carried out so as to form on the glass plate 11 a silica aerogel thin film having a thickness of 20 μm in which the particles of the fluorescent material were dispersed, whereby a plane light emitting device (B) having a structure shown in FIG. 7 was produced.

Comparative Example 4

A protection film was formed on a glass plate 11 as in Example 6, and then similarly to Example 6 but without the formation of the silica aerogel thin film 16 a PL luminous layer 5 of $Y_2O_3$:Eu was formed on the protection film by the printing method, whereby a plane light emitting device was produced.

Comparative Example 5

A protection film was formed on a glass plate 11 as in Example 6, and then similarly to Example 7 but without the formation of the silica aerogel thin film 16 a PL luminous layer 5 of $Y_2O_3$:Eu was formed on the protection film by the sputtering method, whereby a plane light emitting device was produced.

A plane fluorescent lamp was produced using each of the plane light emitting devices according to Examples 6 to 8 and Comparative Examples 4 and 5. An inert gas mixture of He and Xe was charged in the closed space, and an ultraviolet ray (wavelength of 147 nm) was generated by glow discharge in the space. The ultraviolet ray generated light, and a luminance of the lamp surface was measured at an angle of 45° relative to the normal as in the case of Table 1.

The results are shown in Table 2 below.

TABLE 2

|  | luminance ($cd/m^2$) |
| --- | --- |
| Example 6 | 200 |
| Example 7 | 160 |
| Example 8 | 210 |
| Comparative Example 4 | 110 |
| Comparative Example 5 | 70 |

As seen in Table 2, the lamp of each Example has a higher luminance and a brighter plane fluorescent lamp is produced.

What is claimed is:

1. A substrate for a light emitting device, characterized in that the substrate comprises an electrically conductive transparent film which is in contact with at least one surface of a low refractive index member, and the low refractive index member has a refractive index greater than 1 and not greater than 1.30.

2. The substrate for the light emitting device according to claim 1, characterized in that the low refractive index member is made of an aerogel.

3. The substrate for the light emitting device according to claim 1, characterized in that the low refractive index member is made of a silica aerogel.

4. The substrate for the light emitting device according to claim 1, characterized in that the low refractive index member has two surfaces which are opposed to each other, and the electrically conductive transparent film is positioned on one of those surfaces and a transparent member is positioned on the other surface.

5. The substrate for the light emitting device according to claim 4, characterized in that the transparent member is made of a glass or a transparent resin.

6. The substrate for the light emitting device according to claim 3 or 4, characterized in that the low refractive index member has been made hydrophobic.

7. The substrate for the light emitting device according to claim 1, characterized in that the electrically conductive transparent film is made of at least one material selected from the group consisting of indium-tin oxide, indium-zinc oxide, zinc-aluminum oxide, gold, silver, copper and chromium.

8. The substrate for the light emitting device according to claim 1, characterized in that the low refractive index member is in the form of a thin film.

9. A light emitting device which comprises a luminous layer and the substrate for the light emitting device according to claim 1, characterized in that the electrically conductive transparent film has the luminous layer on its one surface which is opposite to its other surface which has the low refractive index member thereon.

10. The light emitting device according to claim 9, characterized in that the luminous layer is an organic EL layer.

11. The light emitting device according to claim 9, characterized in that the luminous layer is an inorganic EL layer.

12. A light emitting device which comprises a luminous layer which is in contact with at least one surface of a low refractive index member of which refractive index is greater than 1 and not greater than 1.30.

13. The light emitting device according to claim 12, characterized in that the low refractive index member is made of an aerogel.

14. The light emitting device of claim 12, wherein the low refractive index member is made of a silica aerogel.

15. A light emitting device comprising a low refractive index member of which refractive index is greater than 1 and not greater than 1.30 is located on a transparent member, and a luminous layer is located on a surface of the low refractive index member in the form of the thin film.

16. The light emitting device according to claim 15, characterized in that the low refractive index member is made of an aerogel.

17. The light emitting device according to claim 15, the transparent member is a glass plate.

18. The light emitting device of claim 15, wherein the low refractive index member is made of a silica aerogel.

19. A light emitting device characterized in that it comprises a luminous layer located on a transparent member, and the luminous layer is made of a low refractive index member in the form of a thin film which contains particles of a luminescent material dispersed therein or which carries such particles, wherein the refractive index member has a refractive index which is greater than 1 and not greater than 1.30.

20. The light emitting device according to claim 19, characterized in that the low refractive index is made of an aerogel.

21. The light emitting device according to claim 19, characterized in that the transparent member is in the form of a glass plate.

22. The light emitting device according to any one of claims 12, 15 and 19 characterized in that the luminous layer of the light emitting device is a PL luminous layer or a layer which emits light by means of irradiation of an electron beam.

23. The light emitting device of claim 19, wherein the low refractive index member is made of a silica aerogel.

* * * * *

UNITED STATES PATENT AND TRADEMARK OFFICE
CERTIFICATE OF CORRECTION

PATENT NO. : 6,762,553 B1
DATED : July 13, 2004
INVENTOR(S) : Hiroshi Yokogawa et al.

It is certified that error appears in the above-identified patent and that said Letters Patent is hereby corrected as shown below:

Column 2,
Line 5, "$\eta=1/(2n_2)$" should read -- $\eta=1/(2n^2)$ --.

Column 7,
Line 25, "layer in" should read -- layer --;
Lines 56 and 59, "member," should read -- members, --;
Line 66, "aspect" should read -- aspects --.

Column 8,
Lines 11 and 23, "aspect" should read -- aspects --.

Column 12,
Line 13, "adjust" should read -- adjusted --.

Column 14,
Line 47, "material a rare" should read -- material, a rare --.

Column 17,
Line 9, "Marcury," should read -- Mercury, --.

Column 18,
Line 18, "carried" should read -- carry --.

Column 21,
Lines 19 and 20, should read as a continuous sentence without a pragraph break as follows:
"film 16 of which
    thickness was 20 $\mu$m was laminated on the glass plate 11." should read
-- film 16 of which thickness was 20 $\mu$m was laminated on the glass plate 11. --

UNITED STATES PATENT AND TRADEMARK OFFICE
CERTIFICATE OF CORRECTION

PATENT NO. : 6,762,553 B1
DATED : July 13, 2004
INVENTOR(S) : Hiroshi Yokogawa et al.

It is certified that error appears in the above-identified patent and that said Letters Patent is hereby corrected as shown below:

Column 21 (cont'd),
Lines 21, should begin as a new pragraph as follows:
"Then, $Y_2O_3$:Eu (fluorescent material in the form of particles," should read
-- Then, $Y_2O_3$:Eu (florescent mateial in the form of particles, --.

Signed and Sealed this

Fifteenth Day of March, 2005

JON W. DUDAS
*Director of the United States Patent and Trademark Office*